(12) United States Patent
Huang et al.

(10) Patent No.: US 11,031,241 B2
(45) Date of Patent: Jun. 8, 2021

(54) METHOD OF GROWING DOPED GROUP IV MATERIALS

(71) Applicant: Applied Materials, Inc., Santa Clara, CA (US)

(72) Inventors: Yi-Chiau Huang, Fremont, CA (US); Errol Antonio C Sanchez, Tracy, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/704,124

(22) Filed: Dec. 5, 2019

(65) Prior Publication Data

US 2020/0203149 A1   Jun. 25, 2020

Related U.S. Application Data

(60) Provisional application No. 62/782,397, filed on Dec. 20, 2018.

(51) Int. Cl.
*H01L 21/02*   (2006.01)

(52) U.S. Cl.
CPC .... *H01L 21/0257* (2013.01); *H01L 21/02524* (2013.01)

(58) Field of Classification Search
None
See application file for complete search history.

(56) References Cited

U.S. PATENT DOCUMENTS

| | | | |
|---|---|---|---|
| 5,332,689 A | 7/1994 | Sandhu et al. | |
| 9,502,298 B2 | 11/2016 | Tsai et al. | |
| 2011/0088760 A1* | 4/2011 | Sheng | H01L 21/02576 136/255 |
| 2012/0306054 A1* | 12/2012 | Huang | H01L 21/02532 257/616 |
| 2015/0361583 A1 | 12/2015 | Zheng et al. | |
| 2016/0079064 A1* | 3/2016 | Nainani | H01L 21/2254 438/559 |
| 2016/0260611 A1 | 9/2016 | Consiglio et al. | |
| 2019/0096745 A1* | 3/2019 | Wang | H01L 21/76251 |
| 2019/0109209 A1* | 4/2019 | Charles | H01L 29/7787 |
| 2019/0244813 A1* | 8/2019 | Reboud | H01L 21/02236 |
| 2020/0203481 A1 | 6/2020 | Thareja et al. | |

FOREIGN PATENT DOCUMENTS

WO   2012065170 A2   5/2012

OTHER PUBLICATIONS

International Search Report and Written Opinion dated Mar. 23, 2020 for Application No. PCT/US2019/064588.

\* cited by examiner

*Primary Examiner* — Alexander G Ghyka
(74) *Attorney, Agent, or Firm* — Patterson + Sheridan, LLP (57) ABSTRACT

Methods for forming films during semiconductor device fabrication by soaking a substrate in dopant are discussed herein. The dopant soak is performed in a process chamber using at least one dopant precursor for a predetermined period of time to form a dopant layer on the substrate. The process chamber is subsequently purged of the at least one dopant precursor. At least one film precursor is introduced into the process chamber after the process chamber is purged. A film is epitaxially formed on the substrate to have at least one of a target resistivity, dopant concentration, and/or thickness. Post-processing operations can include annealing or patterning the semiconductor film, or depositing additional layers thereon.

20 Claims, 4 Drawing Sheets

METHOD OF GROWING DOPED GROUP IV MATERIALS

CROSS-REFERENCE TO RELATED APPLICATIONS

This application claims benefit of U.S. provisional patent application Ser. No. 62/782,397, filed Dec. 20, 2018, which is herein incorporated by reference in its entirety.

BACKGROUND

Field

Embodiments described herein generally relate to semiconductor device fabrication, including the growth of Group IV films on substrates.

Description of the Related Art

Semiconductor devices include film stacks fabricated by depositing and patterning films of varying compositions and thicknesses. Semiconductor films can be epitaxially deposited on a substrate, such as a silicon wafer, or on a previously formed and/or patterned film. During film deposition, one or more dopants can be used to form doped semiconductor films. Conventionally, doped semiconductor films are formed by introducing one or more dopant precursors and one or more film precursors into a process chamber in a co-flowed manner. Co-flowing dopant precursors and film precursors can result in the segregation of the dopant from the deposited film, in particular when the dopant has a low solubility in the deposited film. The segregation of the dopant can impede further operations including the formation of other films over the doped film. Doped semiconductor films can also be formed using dopant implantation. However, dopant implantation uses high temperatures and thus has a higher thermal budget than the thermal budget available for some semiconductor device fabrication processes.

Thus, there is a need for an improved system and method of fabricating doped semiconductor films.

SUMMARY

The present disclosure generally relates to systems and methods for forming a semiconductor films.

In one or more embodiments, a method of forming a semiconductor film includes introducing at least one dopant precursor comprising a dopant to a process chamber while a substrate is positioned therein; soaking the substrate in the at least one dopant precursor for a first predetermined period of time to form a dopant layer on the substrate; purging the at least one dopant precursor from the process chamber to remove the at least one dopant precursor from the process chamber while the dopant layer remains on the substrate; and introducing a semiconductor film precursor to the process chamber to form a semiconductor film on the substrate, the semiconductor film including a group IV element and having a concentration of the dopant from about $1.0\times10^{19}$ atoms/cm$^3$ to about $5.0\times10^{21}$ atoms/cm$^3$.

In one or more embodiments, a method of forming a semiconductor film includes positioning a substrate in a process chamber; introducing at least one dopant precursor comprising a dopant to the process chamber; soaking the substrate in the at least one dopant precursor for a first predetermined period of time to form a dopant layer on the substrate, the substrate maintained at a temperature from 200° C. to 450° C. during the soaking; purging the at least one dopant precursor from the process chamber to remove the at least one dopant precursor from the process chamber while the dopant layer remains on the substrate; and introducing a semiconductor film precursor to the process chamber to form a semiconductor film on the substrate, the semiconductor film including a group IV element and having a concentration of the dopant from about $1.0\times10^{19}$ atoms/cm$^3$ to about $5.0\times10^{21}$ atoms/cm$^3$, wherein the dopant precursor and the semiconductor film precursor are present in the process chamber at non-overlapping time periods.

In one or more embodiments, a method of forming a semiconductor film includes introducing at least one dopant precursor comprising a dopant to a process chamber while a substrate is positioned therein; soaking the substrate in the at least one dopant precursor for a first predetermined period of time to form a dopant layer on the substrate; purging the at least one dopant precursor from the process chamber to remove the at least one dopant precursor from the process chamber while the dopant layer remains on the substrate; introducing a film precursor to the process chamber to form a film on the substrate, the film having a concentration of the dopant from about $1.0\times10^{19}$ atoms/cm$^3$ to about $5.0\times10^{21}$ atoms/cm$^3$; and repeating the introducing the at least one dopant precursor, the soaking the substrate, the purging the at least one dopant precursor, and the introducing the semiconductor film precursor for a plurality of iterations.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure are directed towards forming doped semiconductor films, including doped Group IV semiconductor films. Group IV semiconductor films include silicon (Si), germanium (Ge), and combinations thereof. Using the systems and methods discussed herein, a substrate is positioned in a process chamber for processing, and undergoes a dopant soaking process. At least one dopant precursor is introduced to the process chamber prior to introducing a semiconductor film precursor. In some examples, two or more dopants are introduced in a simultaneous or staggered manner to the process chamber. The substrate is soaked in the dopant precursor for a predetermined period of time.

After formation of the dopant layer, the process chamber is purged to remove the dopant precursor. Subsequent to the purge, one or more semiconductor film precursors are introduced to the process chamber. Thus, the dopant precursor gas is not co-flowed into the process chamber at the same time as the semiconductor film precursor (e.g., the dopant precursor and the semiconductor film precursor are provided to the process chamber at separate, non-overlapping time periods). A semiconductor film is epitaxially formed from the one or more film precursors on the substrate over the dopant layer. Subsequently, the substrate can undergo heat treatment, further film formation, and/or film patterning. The semiconductor film resulting from the dopant soaking process has a predetermined dopant concentration level and promotes formation of subsequent films on top of the doped semiconductor film.

In some examples, a substrate can have one or more semiconductor films formed thereon, each semiconductor film can be formed using iterations of the soaking and epitaxial semiconductor film formation discussed herein. Depending upon the example, when a plurality of semiconductor films are formed, the dopant(s) used in a first iteration to form a first semiconductor film of the plurality of semiconductor films can be different than the dopant(s) used to form a second semiconductor film of the plurality of semiconductor films. Thus, one or more films can be formed from a plurality of semiconductor films, each formed after soaking the substrate in the same, similar, or differing dopants or dopant types.

Figure 1:
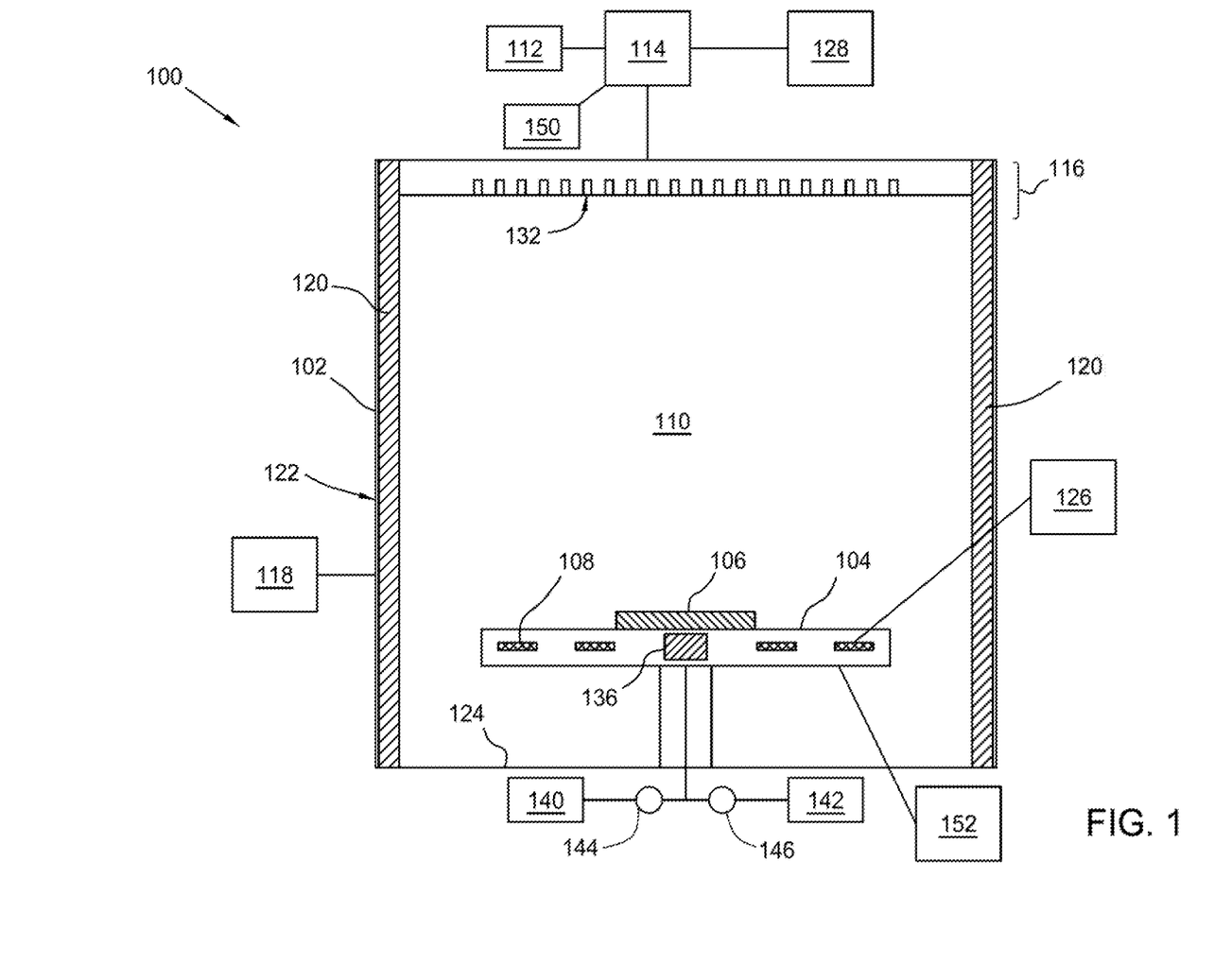
FIG. 1 is a schematic illustration of a substrate processing system according to embodiments of the present disclosure.

FIG. 1 is a schematic illustration of a substrate processing system 100 according to embodiments of the present disclosure. The substrate processing system 100 includes a process chamber 102. In some examples, the process chamber 102 is part of an integrated chamber cluster tool that includes a plurality of process chambers arranged around a transfer chamber. The process chamber 102 has a substrate support 104 disposed within a process volume 110 of the process chamber 102. In some examples, the substrate support 104 is a substrate support pedestal. The process volume 110 is defined, for example, between the substrate support 104 and a gas distribution assembly 116 disposed opposite the substrate support 104. In some embodiments, the substrate support 104 may include a mechanism that retains or supports a substrate 106 on top surface of the substrate support 104. Exemplary substrate retention mechanisms may include an electrostatic chuck, a vacuum chuck, a substrate retaining clamp, or the like.

The substrate support 104 can further include mechanisms for controlling the substrate temperature such as heating and/or cooling mechanisms, such as substrate support heating elements 108. In some examples, one or more power source(s) 126 can be configured to heat the substrate support 104 to a predetermined temperature via the substrate support heating elements 108. The substrate support 104 can additionally or alternately include mechanisms for controlling the species flux and/or mechanisms to control ion energy proximate the surface of the substrate 106.

Optionally, in some examples, the substrate support 104 may include an electrode 136 and one or more power sources such as a first bias power source 140 and a second bias power source 142. Each of the first bias power source 140 and the second bias power source 142 is coupled to the electrode 136 via a first matching network 144 and a second matching network 146, respectively. The above described first bias power source 140 and the second bias power source 142 may be capable of producing up to 12,000 W of energy at a frequency of about 2 MHz, or about 13.56 MHz, or about 60 Mhz. The first bias power source 140 and the second bias power source 142 may each provide either continuous or pulsed power. In some embodiments, the first bias power source 140 and the second bias power source 142 may each alternatively be a DC or pulsed DC source. Additionally or alternatively, it is contemplated that remote plasma sources may be utilized for plasma generation.

In one or more embodiments, the gas distribution assembly 116 can be fabricated from aluminum, and, in some examples, can be coated by an oxide such as aluminum oxide ($Al_2O_3$). The gas distribution assembly 116 can be coupled to an RF power source 152 configured to provide power to the gas distribution assembly 116 before, during, and/or after operations within the process chamber 102. The gas distribution assembly 116 includes a plurality of apertures 132 formed therethrough. The plurality of apertures 132 is configured to introduce precursors to the process volume 110. The plurality of apertures 132 of the gas distribution assembly 116 can be arranged in various configurations across the surface of the gas distribution assembly 116, including as concentric rings, ring clusters, randomly positioned clusters, or other geometric shapes. In alternative embodiments, it is contemplated that process gases may be introduced into the process volume 110 using a cross-flow injector which generates a horizontal fluid flow parallel to an upper surface of the substrate 106.

In one example, one or more gas sources 112, 128 are coupled to the process chamber 102 via a gas manifold 114. The gas manifold 114 is fluidly coupled to the gas distribution assembly 116 and one or more gases are introduced to the process volume 110 from the one or more gas sources 112, 128. Each of the one or more gas sources 112, 128 includes one or more of a carrier gas, a dopant precursor, a semiconductor film precursor, combinations thereof, or other gases. It is contemplated that the one or more gas sources 112, 128 may optionally utilize liquid precursor sources.

In some examples, a remote plasma source (RPS) 150 can be used to deliver plasma to the process volume 110 via the gas manifold 114. The process chamber 102 also includes a liner 120 disposed along the sidewall 122 of the process volume 110. One or more exhaust systems 118 are coupled to the process chamber 102 and used to remove excess process gases or by-products from the process volume 110 during processing.

Figure 2:
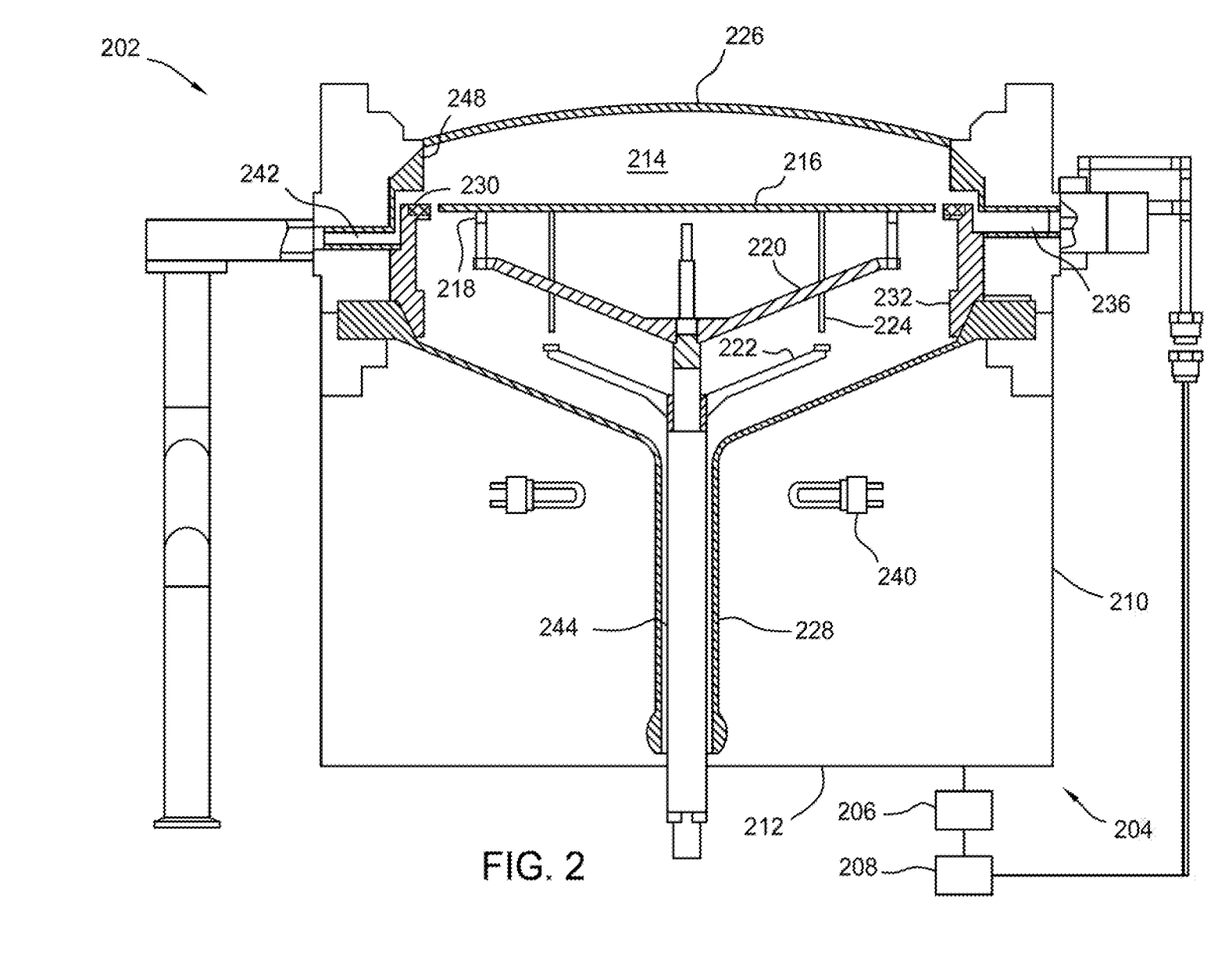
FIG. 2 is a schematic illustration of another substrate processing system according to embodiments of the present disclosure.

FIG. 2 is a cross sectional view of a process chamber 202 according to an embodiment described herein. The process chamber 202 is configured for cross-flow deposition operations. The process chamber 202 includes a chamber body 204, support systems 206, and a controller 208. The chamber body 204 has a sidewall 210 and a bottom wall 212. The process chamber 202 includes an upper window 226 and lower window 228 which define a processing region 214 therebetween. A substrate support 216 used for supporting a substrate is disposed in the interior processing region 214. In one or more embodiments, the substrate support 216 is a susceptor, and may be fabricated from quartz, silicon carbide, or other materials. The substrate support 216 is supported by support posts 218, which are connected with supporting arms 220 that extend from a shaft 244. During operation of the process chamber 202, the substrate disposed on the substrate support 216 may be raised by substrate lift arms 222 through lift pins 224. Alternatively, the substrate support 216 may be omitted, and a substrate may be supported directly on support posts 218. Deposition processes generally occur on the upper surface of a substrate disposed on the substrate support 216 within the interior processing region 214.

An upper liner 248 is disposed below the upper window 226 and is adapted to prevent undesired deposition onto chamber components. The upper liner 248 is positioned adjacent to a preheat ring 230, defining a fluid flow path therebetween. The preheat ring 230 is removably disposed on a ring support 232 that is coupled to the sidewall 210. The heated preheat ring 230 activates the process gases as the process gases flow into the process chamber 202 through the process gas inlet 236, formed adjacent the upper liner 248. The process gases exit the process chamber 202 through the process gas outlet 242, formed adjacent the upper liner 248 opposite the process gas inlet 236. In such a manner, the process gases may flow parallel to the upper surface of the substrate. Thermal decomposition of the process gases, including deposition precursors or dopants, onto the substrate to form one or more layers on the substrate is facilitated by the lamps 240.

The lamps 240 are adapted to provide thermal energy to components positioned within the process chamber 202. For example, the lamps 240 may be adapted to provide thermal energy to the substrate, the substrate support 216, and the preheat ring 230. The lower window 228 may be formed from an optically transparent material, such as quartz, to facilitate the passage or thermal radiation therethrough at one or more wavelength ranges of irradiation provided by the lamps 240.

The support system 206 includes components used to execute and monitor pre-determined processes, such as the growth of films in the process chamber 202. The support system 206 includes one or more of gas panels, gas distribution conduits, vacuum and exhaust sub-systems, power supplies, and process control instruments. A controller 208 is coupled to the support system 206 and is adapted to control the process chamber 202 and support system 206. The controller 208 includes a central processing unit (CPU), a memory, and support circuits. Instructions resident in controller 208 may be executed to control the operation of the process chamber 202. The process chamber 202 is adapted to perform one or more film formation or deposition processes.

While FIGS. 1 and 2 illustrate examples of process chambers, it is contemplated that other processing chambers may be utilized. For example, process chambers such as epitaxial deposition chambers, available form Applied Materials, Inc., of Santa Clara, Calif., may be utilized. It is contemplated that process chambers from other manufacturers, may also be utilized to perform methods disclosed herein.

Figure 3:
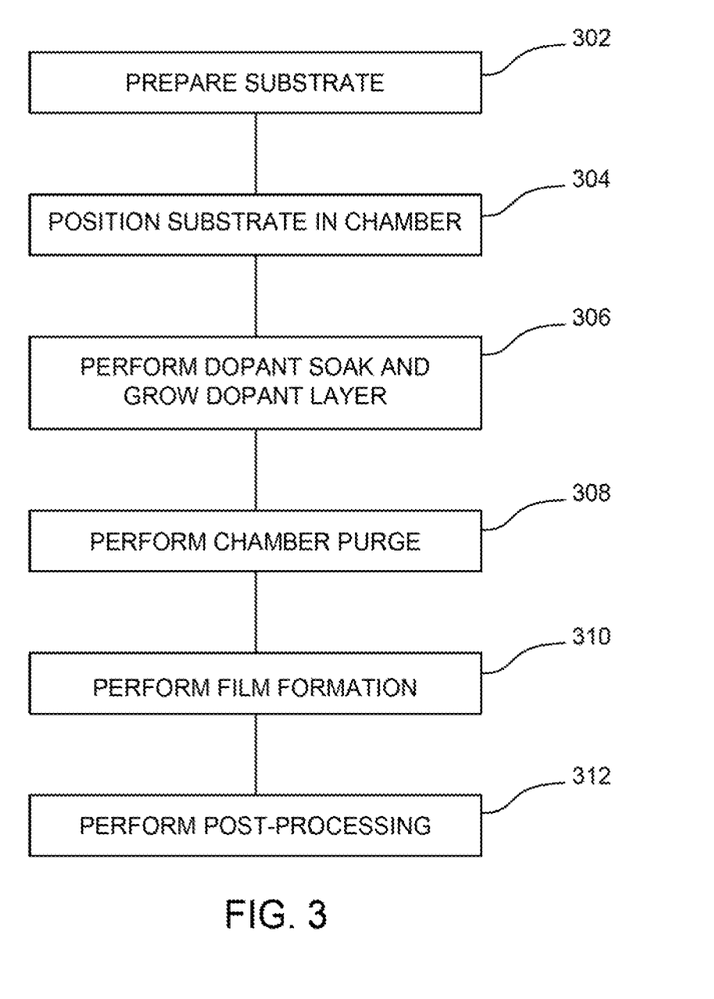
FIG. 3 is a flow diagram of a method of forming a film on a substrate according to embodiments of the present disclosure.
Figure 4A:
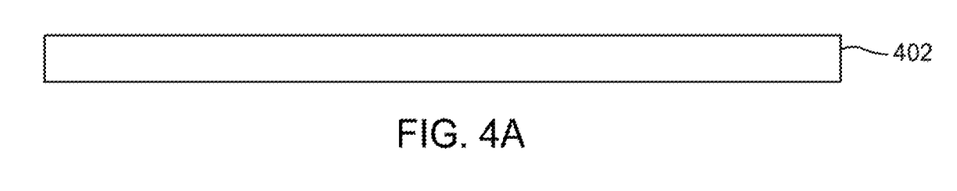
FIGS. 4A-4C are schematic illustrations of formation of a semiconductor film on a substrate according to embodiments of the present disclosure.

FIG. 3 is a method 300 of forming a semiconductor film on a substrate. FIGS. 4A-4C are schematic illustrations of a substrate undergoing the method 300. In the method 300 at operation 302, a substrate 402 as shown in FIG. 4A is prepared for film formation including the removal of native oxide or other impurities. The substrate 402 can be formed from materials including silicon (Si), germanium (Ge), or a combination of Si and Ge. In some examples, the substrate 402 is a semiconductor wafer. In some examples, the substrate 402 is a patterned substrate that includes dielectric surfaces formed from silicon nitride (SiN), silicon dioxide (SiO$_2$), or other materials. Operation 302 can include a high-temperature baking operation and/or a pre-clean operation that uses one or more pre-cleaning gases. In this example, where a pre-clean operation is executed at operation 302, NH$_3$ gas can be used alone or in combination with NF$_3$ plasma from a remote plasma source, such as the remote plasma source, to facilitate cleaning of the substrate. In another example, a high-temperature baking operation is performed at operation 302 to prepare the substrate 402 for further processing. During the high-temperature baking operation, the substrate 402 is exposed to hydrogen (H$_2$) at a temperature from about 700° C. to about 1100° C.

At operation 304, the substrate 402 is positioned on a substrate support in a process chamber, for example, an epitaxial deposition chamber. The process chamber can be configured similarly to the process chamber 102 in FIG. 1, the process chamber 202 in FIG. 2, or another process chamber, such as the Centura® EPI chamber, Centura® RP EPI chamber, or Centura® Pronto™ chamber, available from Applied Materials, Inc., of Santa Clara, Calif.

At operation 306 in the method 300, one or more dopant precursors are introduced to the process chamber to soak the substrate 402. In one example, the dopant precursor includes gallium (Ga) provided by a source such as trimethylgallium or triethylgallium. In such an example, a vaporizer or bubbler is utilized to facilitate delivery of the precursor to the processing region of the process chamber. In other examples, the one or more dopant precursors introduced at operation 306 can be gaseous precursors. Additionally or alternatively, the dopant precursor(s) can include one or more of boron (B), indium (In), tin (Sn), germanium (Ge), phosphorous (P), or arsenic (As). The one or more dopant precursors can be introduced at operation 306 at a flow rate of less than about 5 sccm, for example, from about 1 sccm to about 5 sccm. In an example where two or more dopant precursors are introduced at operation 306, each dopant precursor can be introduced at the same flow rate. In another example where two or more dopant precursors are introduced at operation 306, at least one dopant precursor can be introduced at a flow rate that is different than the flow rate of another, different precursor. The one or more dopant precursors can be introduced at operation 306 while the substrate 402 is maintained at a temperature from about 200° C. to about 450° C., such as about 360° C. to about 420° C. The one or more dopants introduced at operation 306 can include dopants that each exhibit a solubility of $1 \times 10^{20}$ or below in Group IV elements or combinations of Group IV elements. The substrate 402 can soak in the one or more dopants at operation 306 for a period of about 30 seconds to a period of about 5 minutes.

Figure 4B:
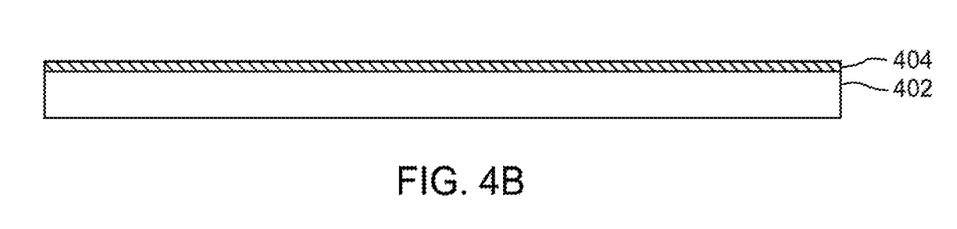

As the dopant soak is performed at operation 306, a dopant layer 404 is formed from pure dopant as shown on the substrate 402 in FIG. 4B. The dopant layer 404 can be formed to a target thickness. In one example, the target thickness of the dopant layer 404 can be several angstroms. For example, the dopant layer 404 may have a thickness within a range of about 2 angstroms to about 10 angstroms, such as about 2 angstroms to about 5 angstroms. The target thickness can be selected as to form a minimum dopant concentration level in one or more films subsequently formed on top of the dopant layer 404. In one example, the temperature of the substrate 402 during operation 306 is from about 200° C. to about 450° C. In some examples, the process chamber can be pressurized during operation 306, for example, to a pressure below about 200 Torr.

Subsequent to forming the dopant layer 404 at operation 306, the one or more dopant precursor(s) are purged from the process chamber at operation 308, while leaving the dopant layer 404 on the substrate. In one example of the process chamber purge at operation 308, the one or more dopant precursors are purged using a purge gas at a flow rate of about 5 standard-liter/minute (SLM) to about 30 SLM. The purge time at operation 308 can vary depending upon the process volume, dopant precursor type(s), flow rate of the purge gas, and/or other process or operational parameters. Purging removes the one or more dopant precursor(s) from the process chamber prior to the introduction of other precursors, such as film formation precursors. Examples of purge gases included, but are not limited to noble gases and diatomic nitrogen.

Figure 4C:
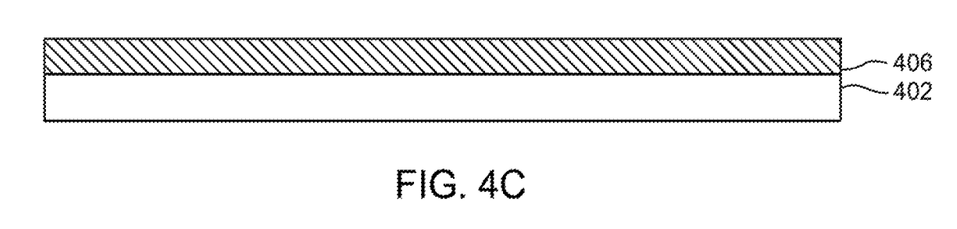

At operation 310, subsequent to purging the one or more dopant precursors at operation 308, a semiconductor film 406 is formed as shown in FIG. 4C. The semiconductor film 406 can be formed from one or more Group IV elements and is formed on the dopant layer 404 on the substrate 402. In one example, the semiconductor film 406 includes one or both of silicon and germanium. The semiconductor film 406 is formed at operation 310 by introducing one or more film precursors to the process volume. As the semiconductor film 406 is formed, the dopant atoms of the dopant layer 404 migrate into the semiconductor film 406, resulting in a predetermined dopant concentration within the semiconductor without excessive segregation of the dopant atoms to the upper surface of the semiconductor film 406. The semiconductor film precursors introduced at operation 310 can include silane ($SiH_4$), germane ($GeH_4$), or variations or combinations thereof. The semiconductor film precursor(s) can be introduced at operation 310 at a flow rate of less than about 500 standard cubic centimeters per minute (sccm) when the process chamber is at a pressure of less than about 200 Torr. Additional gases, such as carrier gases, can be used at operation 310 to facilitate flow of the semiconductor film precursors. Exemplary carrier gases include hydrogen ($H_2$) and argon.

The semiconductor film precursor(s) are introduced at operation 310 after the one or more dopant precursor(s) are purged at operation 308. Thus, the semiconductor film precursor(s) are not co-flowed with the one or more dopant precursors, nor are the semiconductor film precursors present in the process chamber at the same time as the one or more dopant precursor(s), with the exception of the dopant layer 404. A temperature of the substrate 402 during epitaxial formation of the semiconductor film 406 at operation 310 can be substantially similar to the temperature of the substrate 402 at operation 306. That is, the temperature of the substrate 402 during operation 310 can be from about 200° C. to about 450° C. in order to mitigate excessive migration of the dopant through the semiconductor film 406 formed at operation 310 (e.g., to decrease the likelihood and/or extent of dopant diffusion through the semiconductor film 406). While dopant migration from the pure dopant layer 404 through the semiconductor film 406 occurs, the dopant does not migrate through the semiconductor film 406 to significantly segregate from (diffuse through) the semiconductor film 406. Excessive diffusion of the dopant through and out of the semiconductor film 406 can reduce the dopant concentration of the semiconductor film 406 below a target concentration. The migration of the dopant into the semiconductor film 406 produces a doped layer having a dopant concentration above a minimum concentration, such as $1.0\times10^{19}$ atoms/$cm^3$. In various examples, the dopant concentration may or may not be uniform through semiconductor film 406. Similarly, depending upon the embodiment, the dopant concentration may or may not be uniform across the semiconductor film 406. In one example, the concentration of the dopant is greater in a lower portion of the semiconductor film 406 (adjacent the substrate 402) than at an upper portion of the semiconductor film 406). In such an example, the concentration may decrease linearly or non-linearly from a lower portion of the semiconductor film 406 to an upper portion of the semiconductor film 406.

Additionally, while the dopant layer 404 is shown as completely diffused into the semiconductor film 406 in FIG. 4C, it is contemplated that, in some examples, some of the dopant layer 404 may remain in the upper surface of the substrate 402. In such a case, a relatively thin dopant layer may remain interposed between the substrate 402 and the semiconductor film 406. In other examples, the dopant layer 404 may completely, or substantially completely, diffuse into the semiconductor film 406 during formation of the semiconductor film 406.

The semiconductor film 406 (having the diffused dopant(s) therein) formed at operation 310 has a resistivity from about 0.2 mOhm-cm to about 3 mOhm-cm and a dopant concentration from about $1.0\times10^{19}$ atoms/$cm^3$ to about $5.0\times10^{21}$ atoms/$cm^3$. In an example where two or more dopants are introduced at operation 306, the concentration of each dopant in the semiconductor film 406 can be the same or different, depending upon the type of device fabricated in the method 300. A thickness of the semiconductor film 406 can vary from about 100 Å to greater than 1000 Å, depending upon the application. Similarly, the time for semiconductor film formation at operation 310 can vary from about 60 seconds to about 10 minutes or more. The epitaxial growth rate of the semiconductor film 406 during operation 310 can be from about 10 Å/min to about 100 Å/min or greater.

In conventional semiconductor fabrication operations that use co-flowing, dopant precursors and semiconductor precursors are introduced in a simultaneous or overlapping fashion such that the semiconductor film is deposited as a doped film. However, co-flowing results in excessive dopant migration. In contrast, using the systems and methods herein, the pure dopant layer 404 on which the semiconductor film 406 is formed allows for migration of the dopant into the semiconductor film 406, mitigating migration of the dopant out of the semiconductor film 406. Migration of the dopant from the dopant layer 404 forms a semiconductor film 406 having a dopant concentration at or above a minimum dopant concentration level (e.g., $1.0\times10^{19}$ atoms/$cm^3$) that is sufficient for further processing operations. Depending upon the embodiment, operations 306, 308, and 310 can be repeated in an iterative fashion for one or more cycles. In one example, a plurality of cycles of operations 306, 308, and 310 use the same dopant or combination of dopants at operation 306 in each cycle. In another example, at least one cycle of a plurality of cycles of operations 306, 308, and 310 uses a different dopant at operation 306 than another cycle of the plurality of cycles.

At operation 312, the substrate 402 that includes the doped semiconductor film 406, and, in some examples, additional semiconductor films formed in iterations of operations 306, 308, and 310, can undergo one or more post-processing operations. The post-processing at operation 312 can occur in the same process chamber as operations 302-310, or in a different process chamber, and/or in a different process chamber included in an integrated tool that also includes the process chamber used in operations 302-310. In some examples, the post-processing can include a thermal treatment such as annealing at a temperature from 400° C. to 750° C. In other examples, the post-processing at operation 312 can include forming other films or patterning films. While some of the dopant layer 404 can migrate to the top surface of the semiconductor film 406 during post-processing, the dopant level of the semiconductor film 406 is sufficiently maintained during post-processing such that the semiconductor device remains commercially viable.

Benefits of the disclosure include the formation of epitaxial semiconductor films having improved dopant concentration uniformity. In contrast, conventionally doped epitaxial films (such as those formed during co-flow regimes) result in migration of dopant to the top of the epitaxial film of the semiconductor layer, causing a dopant concentration of the semiconductor layer that is less than a target concentration. Thus, in conventional films, the material adjacent a surface of the doped epitaxial film has a greater dopant concentration than remaining portions of the epitaxial film. Dopants co-flowed during growth easily segregate at the surface due to their lower energy state at the surface as well as a minimal energy barrier to migration from near-surface or sub-surface regions. On the contrary, dopant that is buried far away from the surface (such as dopant formed using the soak method discussed herein) still has to surmount a higher diffusion barrier through the thickness of the film before reaching a low energy state at the surface. However, in the present disclosure, dopant atoms are concentrated in a pure layer on an upper surface of the substrate when the substrate undergoes dopant soaking, prior to epitaxial film formation. Accordingly, as the semiconductor film is formed, dopant atoms migrate into the semiconductor film, resulting in an increased concentration of dopant retained within the epitaxial film, compared to films formed by conventional approaches.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a semiconductor film, comprising:
    introducing at least one dopant precursor comprising a dopant to a process chamber while a substrate is positioned therein;
    soaking the substrate in the at least one dopant precursor for a first predetermined period of time to form a dopant layer on the substrate;
    purging the at least one dopant precursor from the process chamber to remove the at least one dopant precursor from the process chamber while the dopant layer remains on the substrate; and
    introducing a semiconductor film precursor to the process chamber to form a semiconductor film on the substrate, the semiconductor film including a group IV element and having a concentration of the dopant from about $1.0 \times 10^{19}$ atoms/cm$^3$ to about $5.0 \times 10^{21}$ atoms/cm$^3$.

2. The method of claim 1, wherein the semiconductor film has a resistivity from about 0.2 mOhm-cm to about 3 mOhm-cm.

3. The method of claim 1, further comprising maintaining the substrate at a temperature from 200° C. to 450° C.

4. The method of claim 1, wherein the at least one dopant precursor is introduced at a flow rate of less than 5 sccm.

5. The method of claim 1, wherein the first predetermined period of time is from about 30 seconds to about 5 minutes.

6. The method of claim 1, wherein the at least one dopant precursor comprises gallium, indium, boron, phosphorous, arsenic, tin, germanium, or combinations thereof.

7. The method of claim 1, wherein introducing the at least one dopant precursor, soaking the substrate, purging the at least one dopant precursor, and introducing the semiconductor film precursor are repeated for a plurality of iterations to form one or more semiconductor films.

8. The method of claim 1, wherein the introducing at least one dopant precursors comprises introducing two or more dopant precursors.

9. The method of claim 1, wherein the at least one dopant precursor is not co-flowed into the process chamber at the same time as the semiconductor film precursor.

10. The method of claim 1, further comprising preparing the substrate for film formation through a pre-clean operation.

11. The method of claim 1, wherein there is not a visual distinction between the dopant layer and the semiconductor film.

12. The method of claim 1, wherein the semiconductor film precursor is introduced at a flow rate of less than about 500 sccm.

13. The method of claim 1, further comprising maintaining the process chamber at a pressure of less than 200 Torr during the soaking.

14. A method of forming a semiconductor film, comprising:
    positioning a substrate in a process chamber;
    introducing at least one dopant precursor comprising a dopant to the process chamber;
    soaking the substrate in the at least one dopant precursor for a first predetermined period of time to form a dopant layer on the substrate, the substrate maintained at a temperature from 200° C. to 450° C. during the soaking;
    purging the at least one dopant precursor from the process chamber to remove the at least one dopant precursor from the process chamber while the dopant layer remains on the substrate; and
    introducing a semiconductor film precursor to the process chamber to form a semiconductor film on the substrate, the semiconductor film including a group IV element and having a concentration of the dopant from about $1.0 \times 10^{19}$ atoms/cm$^3$ to about $5.0 \times 10^{21}$ atoms/cm$^3$, wherein the dopant precursor and the semiconductor film precursor are present in the process chamber at non-overlapping time periods.

15. The method of claim 14, wherein there is not a visual distinction between the dopant layer and the semiconductor film.

16. The method of claim 14, further comprising maintaining the substrate at a temperature from 200° C. to 450° C. during the introducing the semiconductor film precursor.

17. The method of claim 14, further comprising maintaining the process chamber at a pressure of less than 200 Torr.

18. A method of forming a semiconductor film, comprising:
    introducing at least one dopant precursor comprising a dopant to a process chamber while a substrate is positioned therein;
    soaking the substrate in the at least one dopant precursor for a first predetermined period of time to form a dopant layer on the substrate;
    purging the at least one dopant precursor from the process chamber to remove the at least one dopant precursor from the process chamber while the dopant layer remains on the substrate;
    introducing a film precursor to the process chamber to form a film on the substrate, the film having a concentration of the dopant from about $1.0 \times 10^{19}$ atoms/cm$^3$ to about $5.0 \times 10^{21}$ atoms/cm$^3$; and repeating the introducing the at least one dopant precursor, the soaking the substrate, the purging the at least one dopant precursor, and the introducing the film precursor for a plurality of iterations.

19. The method of claim 18, wherein the at least one dopant precursor and the film precursor are present in the process chamber at non-overlapping time periods.

20. The method of claim 18, further comprising:

maintaining the substrate at a temperature from 200° C. to 450° C. during the soaking and the introducing the film precursor; and maintaining the process chamber at a pressure of less than 200 Torr during the soaking.

* * * * *